US007893529B2

United States Patent
Hsu et al.

(10) Patent No.: US 7,893,529 B2
(45) Date of Patent: Feb. 22, 2011

(54) THERMOELECTRIC 3D COOLING

(75) Inventors: Louis Lu-Chen Hsu, Fishkill, NY (US);
Ping-Chuan Wang, Hopewell Junction, NY (US); Xiaojin Wei, Poughkeepsie, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/351,878

(22) Filed: Jan. 12, 2009

(65) Prior Publication Data

US 2010/0176506 A1 Jul. 15, 2010

(51) Int. Cl.
*H01L 23/24* (2006.01)
*H01L 23/02* (2006.01)

(52) U.S. Cl. .................. 257/713; 257/686; 257/712; 257/717; 257/E23.107; 257/E23.108; 257/930; 136/203

(58) Field of Classification Search .............. 257/686, 257/717, E23.107–E23.108, 712, 930; 136/203
See application file for complete search history.

(56) References Cited

U.S. PATENT DOCUMENTS

| 5,318,743 | A | * | 6/1994 | Tokiai et al. | 419/38 |
|---|---|---|---|---|---|
| 5,552,633 | A | * | 9/1996 | Sharma | 257/700 |
| 5,818,748 | A | | 10/1998 | Bertin et al. | |
| 6,043,982 | A | * | 3/2000 | Meissner | 361/704 |
| 6,496,370 | B2 | * | 12/2002 | Geusic et al. | 361/699 |
| 6,501,111 | B1 | | 12/2002 | Lowrey | |
| 6,548,894 | B2 | | 4/2003 | Chu et al. | |
| 6,713,862 | B2 | * | 3/2004 | Palanisamy et al. | 257/703 |
| 6,767,766 | B2 | | 7/2004 | Chu et al. | |
| 6,893,902 | B2 | * | 5/2005 | Cordes et al. | 438/122 |
| 7,276,787 | B2 | * | 10/2007 | Edelstein et al. | 257/698 |
| 7,541,644 | B2 | * | 6/2009 | Hirano et al. | 257/347 |
| 7,633,154 | B2 | * | 12/2009 | Dai et al. | 257/712 |
| 2005/0006754 | A1 | * | 1/2005 | Arik et al. | 257/712 |
| 2006/0145356 | A1 | * | 7/2006 | Liu et al. | 257/777 |
| 2007/0096263 | A1 | * | 5/2007 | Furukawa et al. | 257/621 |
| 2007/0194465 | A1 | * | 8/2007 | Dai et al. | 257/794 |

OTHER PUBLICATIONS

A Novel VLSI Technology to Manufacture High-Density Thermoelectric Cooling Devices, Howard Chen, Louis Hsu, and Xiaojin Wei. ISBN: 978-2-35500-002-7, Therminic 2007 pp. 1-6, Budapest, Hungary, Sep. 17-19, 2007.

* cited by examiner

*Primary Examiner*—Zandra Smith
*Assistant Examiner*—Jeremy J Joy
(74) *Attorney, Agent, or Firm*—Katherine S. Brown

(57) ABSTRACT

The invention comprises a 3D chip stack with an intervening thermoelectric coupling (TEC) plate. Through silicon vias in the 3D chip stack transfer electronic signals among the chips in the 3D stack, power the TEC plate, as well as distribute heat in the stack from hotter chips to cooler chips.

12 Claims, 12 Drawing Sheets

THERMOELECTRIC 3D COOLING

BACKGROUND

The disclosure relates generally to integrated circuits (ICs), and, more particularly, to a structure and method for cooling a three dimensional (3D) chip stack.

To pack multiple semiconductor integrated chips into a compact device, such as a cell phone, PDA, GPS, or laptop computer, packaging with 3D chip stack becomes increasingly popular. A 3D chip stack allows designers or assemblers greater flexibility to stack various chip technologies into small, high performance functional blocks. For example, flash memories combined with SRAM, DRAM, DSP, or microprocessors are all candidates for this 3D chip stack technique. One can even stack silicon chips with III-V compound chips, which can not be easily fabricated monolithically.

Stacking ultra-thin chips may be interconnected using wire-bonding, or by a combination of wire-bonding and flip-chip assembly. The use of wire-bonding as the exclusive means of interconnection is somewhat restrictive, since the number of stacked die that may be wire-bonded may be limited to only three. Some techniques also allow for stacking of chips with largely varying dimensions, as well as the integration of thin-film passive components in a 3D interconnect stack.

3D chip stacks may need to include a cooling mechanism. When two chips are bonded together, one side of each chip is exposed to the air, which can be cooled by the ambient cool air. However, when more chips are bonded together, such as in a 3D chip stack, chips in the middle are not exposed to ambient air. Lack of exposure to ambient air for middle chips may not be a problem for chips that consume less power. For example, memory chips generally consume less power than high-speed CPU chips, and therefore, memory chips generate less heat, than CPU chips. Therefore, a separate cooling mechanism would not necessarily be required for a 3D memory chip stack. For high-speed CPU chips, which consume more power, and therefore generate more heat, a separate cooling mechanism may be necessary for a 3D CPU chip stack.

BRIEF SUMMARY

A first embodiment of the invention comprises a semiconductor structure with a first chip, second chip, and a thermoelectric plate inserted between the first and second chips. The first chip includes at least one electronic device and a through silicon via electrically connected to the electronic device. The second chip includes at least one electronic device and a through silicon via electrically connected to the electronic device. The thermoelectric plate is separated from the first chip by a first coupling layer and from the second chip by a second coupling layer.

A second embodiment of the invention comprises a method for fabricating a semiconductor structure. The method includes the step of providing a first chip with at least one electronic device. The method includes the step of providing a second chip with at least one electronic device and a through silicon via electronically connected to the electronic device. The method includes the step of forming a thermoelectric plate with a through silicon via. The thermoelectric plate is located between the first and second chip and separated from the first chip by a first coupling layer and separated from the second chip by a second coupling layer.

BRIEF DESCRIPTION OF THE SEVERAL VIEWS OF THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference to the detailed description which follows, taken in conjunction with the accompanying figures, in which:

DETAILED DESCRIPTION

The invention will now be described with reference to the accompanying figures. In the figures, various aspects of the structures have been depicted and schematically represented in a simplified manner to more clearly describe and illustrate the invention.

By way of overview and introduction, the embodiments of the invention are directed to thermo-electric 3D cooling. A first and second coupling layer separate a thermoelectric cooling (TEC) plate from a first and second chip. Each chip has electronic devices embedded therein. Through silicon vias (TSVs) are used for various purposes in the 3D chip stack. One TSV traverses the TEC but is electrically isolated from the TEC. Such TSV electrically connects a device in the first chip with a device in the second chip. Another TSV electrically connects the TEC with a heat sink. The TEC, sandwiched between two chips, dissipates heat generated by hot chips in the 3D stack and transfers heat to cold chips. Generally, chips located in the middle of the 3D stack are hotter than those located close to the upper and lower surfaces of the 3D stack. Such TSV then sends that heat to a heat sink or heat exchanger, which dissipates the heat from the 3D stack. Yet another TSV electronically connects the TEC with a power source. Such TSV powers the thermoelectric plate.

Cooling stacked 3D chips is not a straightforward challenge because of the various considerations the 3D chip designer must contemplate. The alignment and bonding among chips and modules is one consideration. Cooling stacked 3D chips also requires consideration of the electrical paths through the module to form connection from one chip to another. Cooling stacked 3D chips further requires the consideration of the functionality of each chip in order to properly arrange the plurality of chips and modules. For example, CPU chips inherently consume more power and thus generate more heat than the memory chips. Finally, heat dissipation is a consideration. Sometimes heat is dissipated from one to another chip, or from center core of the stack to the side of the stack, so that it can be effectively removed by means of heat sink or heat exchanger attached at the outside boundaries.

Figure 1:
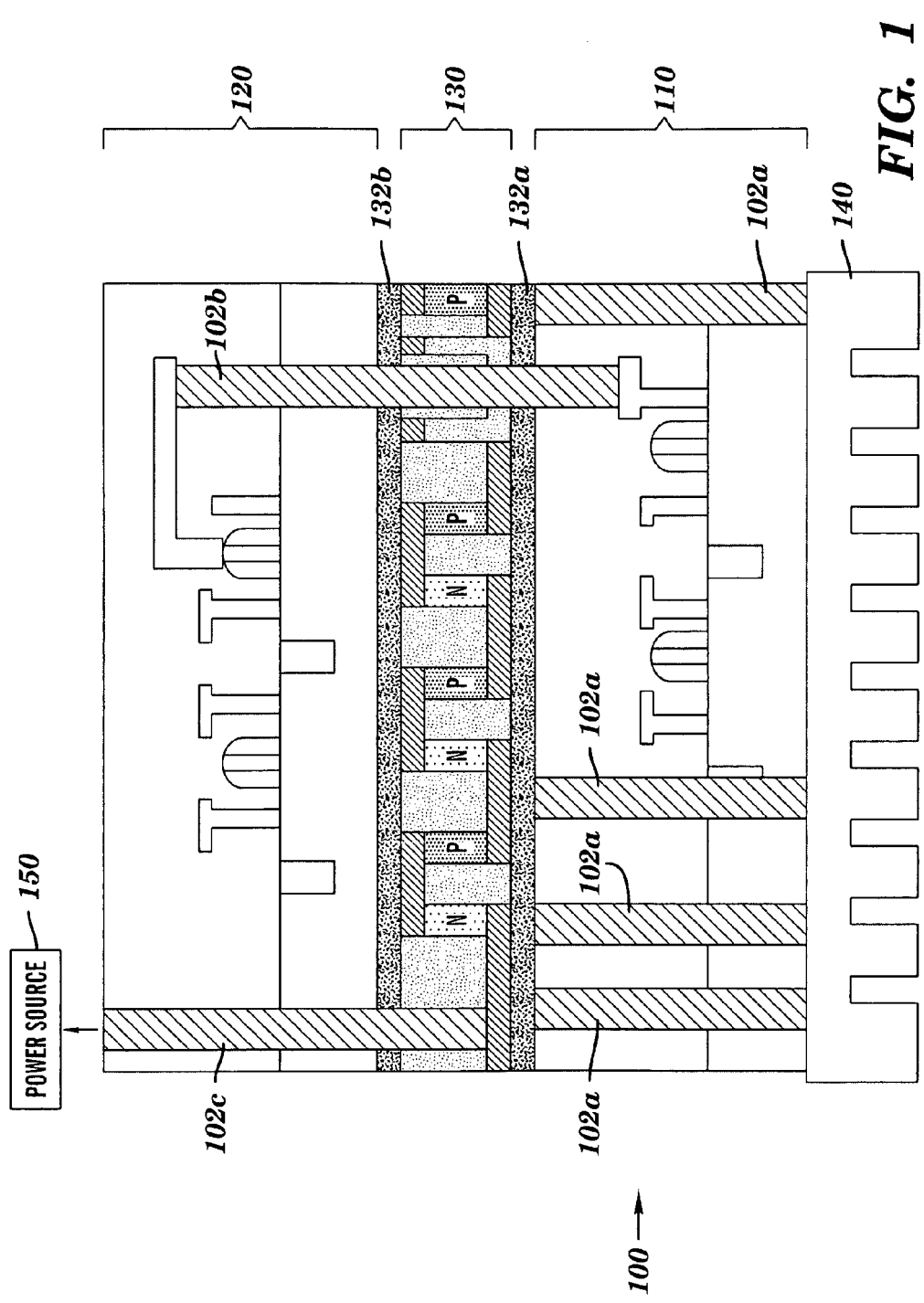
FIG. 1 depicts an embodiment of the invention.

With reference now to FIG. 1, FIG. 1 depicts an embodiment of the invention. As depicted the embodiment comprises two chips 110, 120 separated by a TEC plate 130. While various TSVs 102a, 102b, and 102c are depicted in FIG. 1, each TSV may serve a unique purpose. TSVs 102a dissipate heat from the TEC plate 130 to a heat sink 140. A device in chip 120 generates the heat, which the TEC plate 130 transfers to chip 110 and through TSV 102a sends to heat sink 140. TSV 102b, on the other hand, which traverses the TEC plate 130, remains electronically isolated from TEC plate 130, and yet connects the upper chip 120 and the lower chip 110. Lastly, TSV 102c provides power from power source 150 to the TEC plate 130.

Note that the TEC plate 130 serves as a solid-state heat pump that consists of multiple pairs of N-type and P-type semiconductors as thermoelectric elements connecting electrically in series and thermally in parallel, and it absorbs heat at the cold plate (upper chip 120 in FIG. 1) and releases the heat at the hot plate (lower chip 110 in FIG. 1). In such situation shown in FIG. 1, heat is transferred downward against the temperature gradient. To facilitate further heat transfer from lower chip 110 to the heat sink 140, thermal TSV's 102a filled with high thermal conductivity metals, e.g. copper (Cu), tungsten (W), or aluminum (Al), are placed through the lower chip 110 and in contact with the bottom of the TEC plate and the heat sink 140. Electrical TSV's 102b, which are also filled with high conductivity metals, e.g. copper (Cu), tungsten (W), or aluminum (Al), are placed among the chip stack and through TEC plates to transmit electrical signal to achieve 3D chip integration. Coupling layers 132a and 132b are placed between the TEC plate 130 and the lower chip 110 and upper chip 120, which serve as electrical insulators and provide efficient heat transfer between TEC plate and chips. Dielectric materials with good thermal conductivity, such as CVD diamond or silicon carbide (SiC), are proper candidates for coupling layers 132a, 132b.

The fabrication process for the proposed 3D stack structure with TEC inter-layers is shown in FIGS. 2A-2K. In this example, the TEC plate 130 is fabricated right on top of a chip 110. However, it is conceivable that TEC plate can also be fabricated independently using a carrier and then bonded to a chip.

Figure 2A:
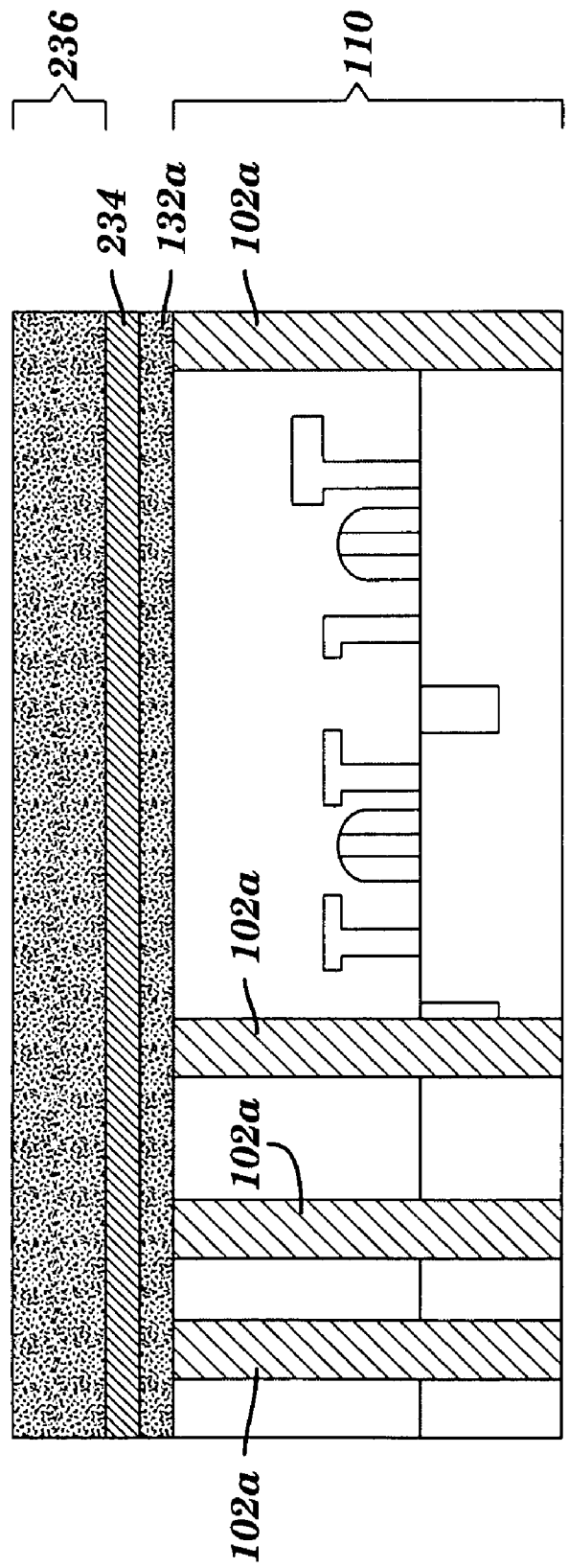
FIGS. 2a-2k depict steps for creation of the embodiment of the invention depicted FIG. 1.

With reference to FIG. 2A, the lower chip 110 is pre-fabricated and integrated with thermal TSV's 102a using a chip/TSV integration process, such as taught in U.S. Pat. No. 7,276,787 entitled "Silicon Chip Carrier with Conductive Through-Vias and Method for Fabricating Same." A blanket coupling layer 132a (about 10 nm~40 nm thick) is then deposited on top of lower chip 110, followed by a conducting layer 234 (e.g. metal such as copper or aluminum, or silicide, about 50 nm~1000 nm thick) and subsequently a layer of thermoelectric material 236 (about 1 um~5 um thick) such as, but not limited to, polysilicon (poly-Si), silicon germanium (SiGe), bismuth telluride ($Bi_2Te_3$), germanium bismuth telluride (GeBiTe) and lead telluride (PbTe). The coupling layer 132a is deposited via chemical vapor deposition (CVD), while conducting layer 234 and thermoelectric layer 236 are deposited via a CVD, physical vapor deposition (PVD), or electro-plating process.

Figure 2B:
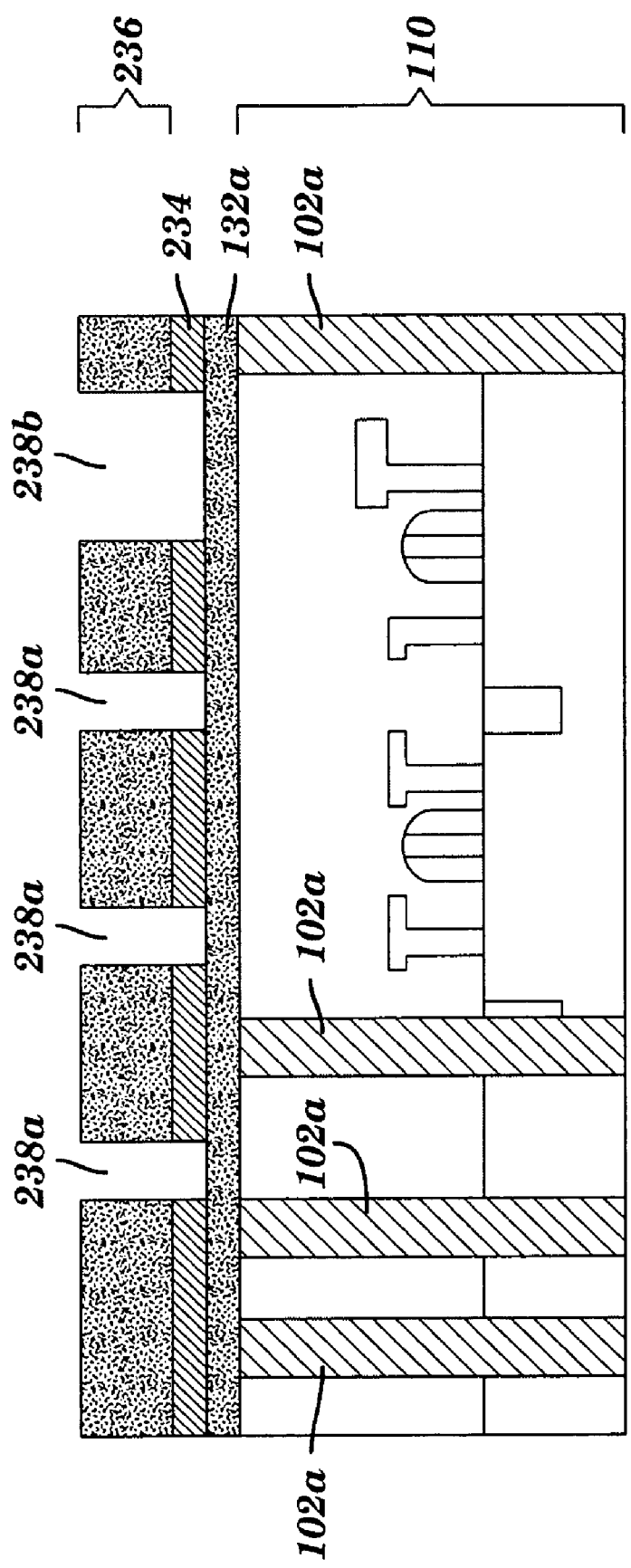

With reference to FIG. 2B, a mask is applied (not shown) and the conducting layer 234 and the thermoelectric layer 236 are patterned using a reactive ion etching (RIE) process that stops on the coupling layer 132a. Notice that FIG. 2B depicts a pattern with two types of openings. The openings 238a are reserved for N and P type regions in the TEC plate 130, while opening 238b is reserved for electrical TSV 102b which provides the electrical connection between the first and second chip.

Figure 2C:
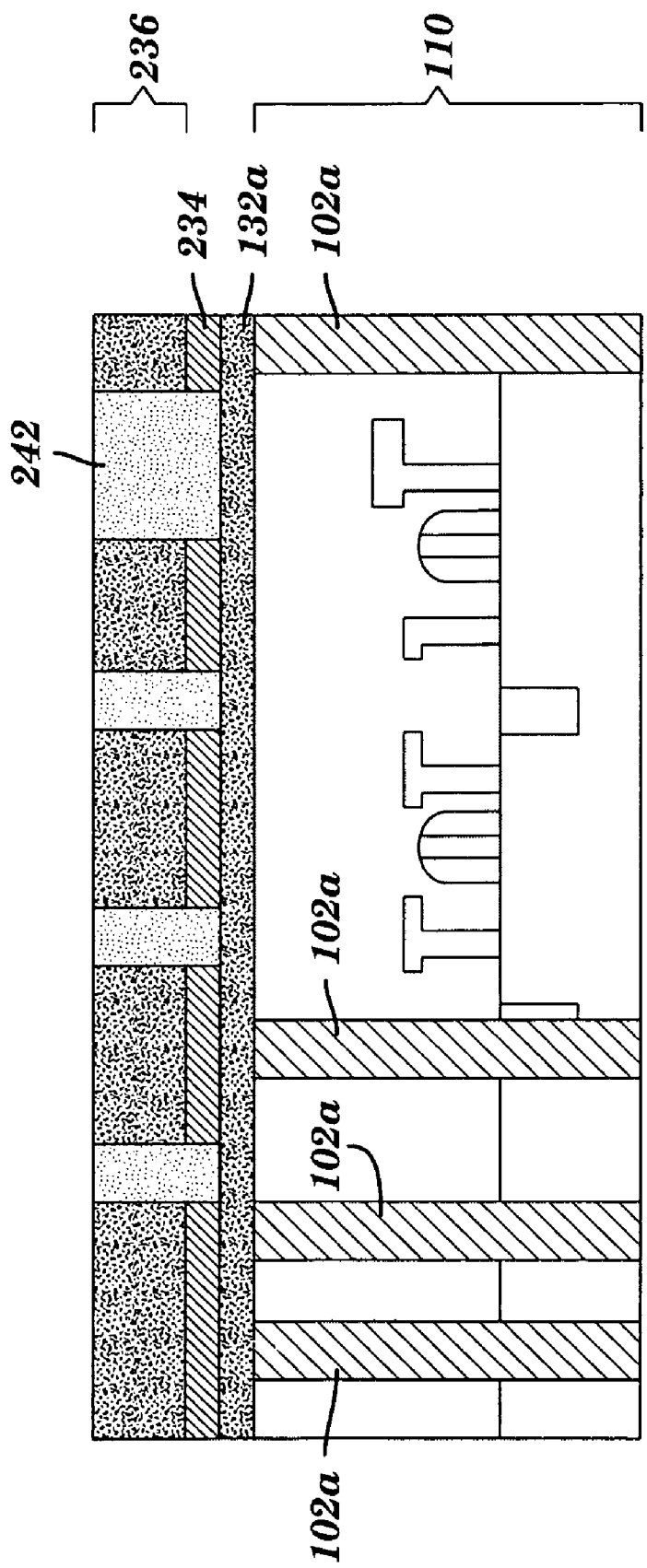

With reference to FIG. 2C, dielectric material 242 is then deposited to fill the patterned openings in the conducting layer 234 and thermoelectric layer 236, followed by chemical-mechanical polishing (CMP) for planarizing the dielectric layer 242. Dielectric materials 242 with low thermal conductivity, for example, but not limited to silicon oxide $SiO_2$, low-k dielectrics such as SiCOH, Silk™, porous low-k dielectrics and an air gap, should be used to enhance thermoelectric efficiency.

Figure 2D:
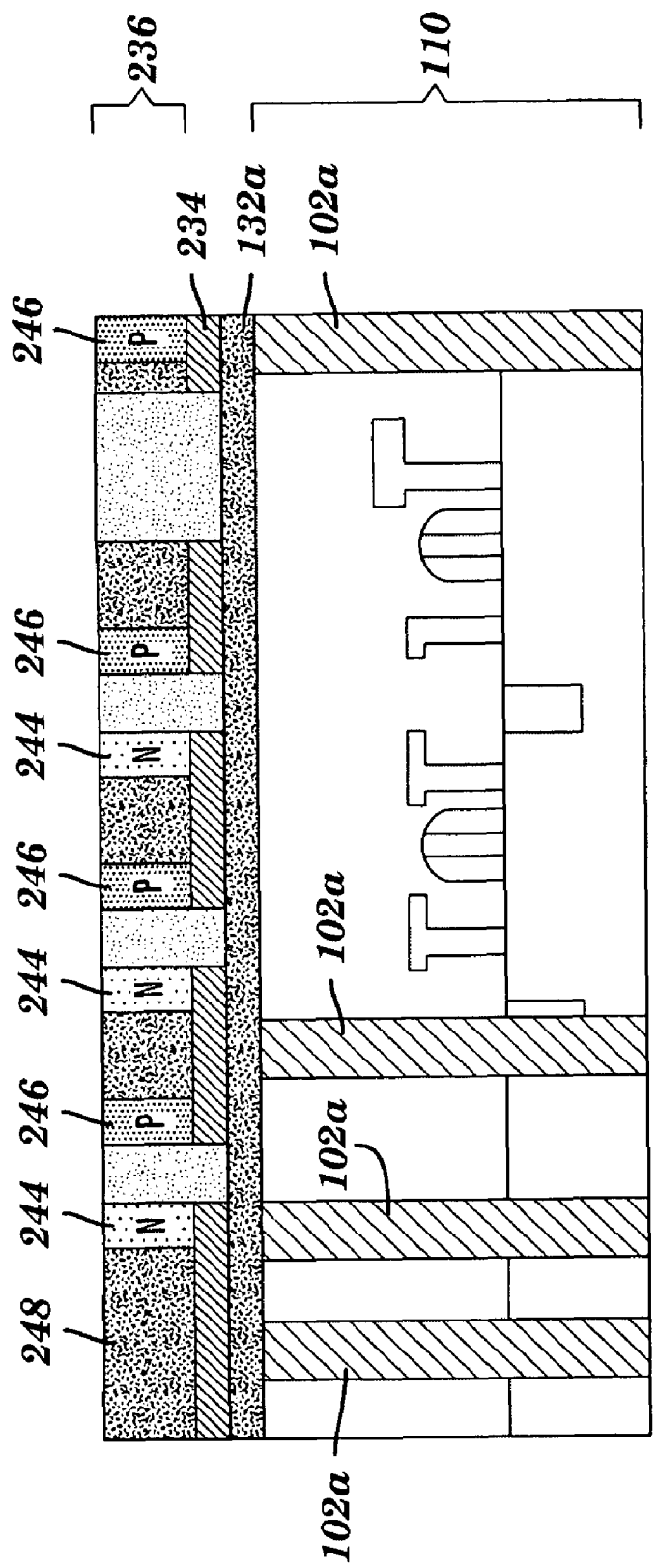

With reference to FIG. 2D, with resist patterning (not shown) and N- and P-type ion implantations (with dosage of about 1e19~1e20 and energy of about 50~10,000 keV), the N-type elements 244 and P-type elements 246 are formed in the thermoelectric layer 236; while regions 248, which are blocked during ion implantation process, remain undoped. Neither adjacent side of the location reserved for the through silicon region 242 has N-type or P-type elements.

Figure 2E:
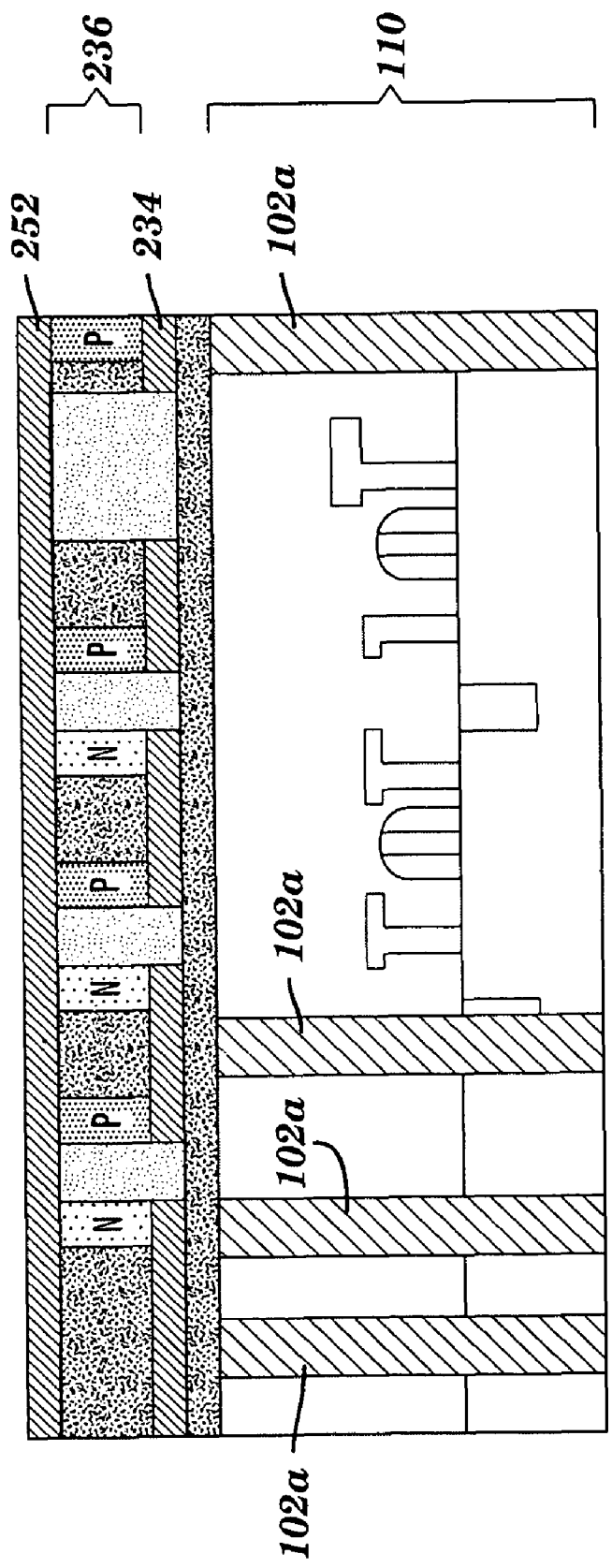

With reference to FIG. 2E, a blanket conducting layer 252 (e.g. metal such as copper (Cu) or aluminum (Al), or silicide, about 50 nm~1000 nm thick) is deposited above the partially doped thermoelectric layer 236. Conducting layer 252 is deposited through use of a CVD, PVD, or electro-plating process.

Figure 2F:
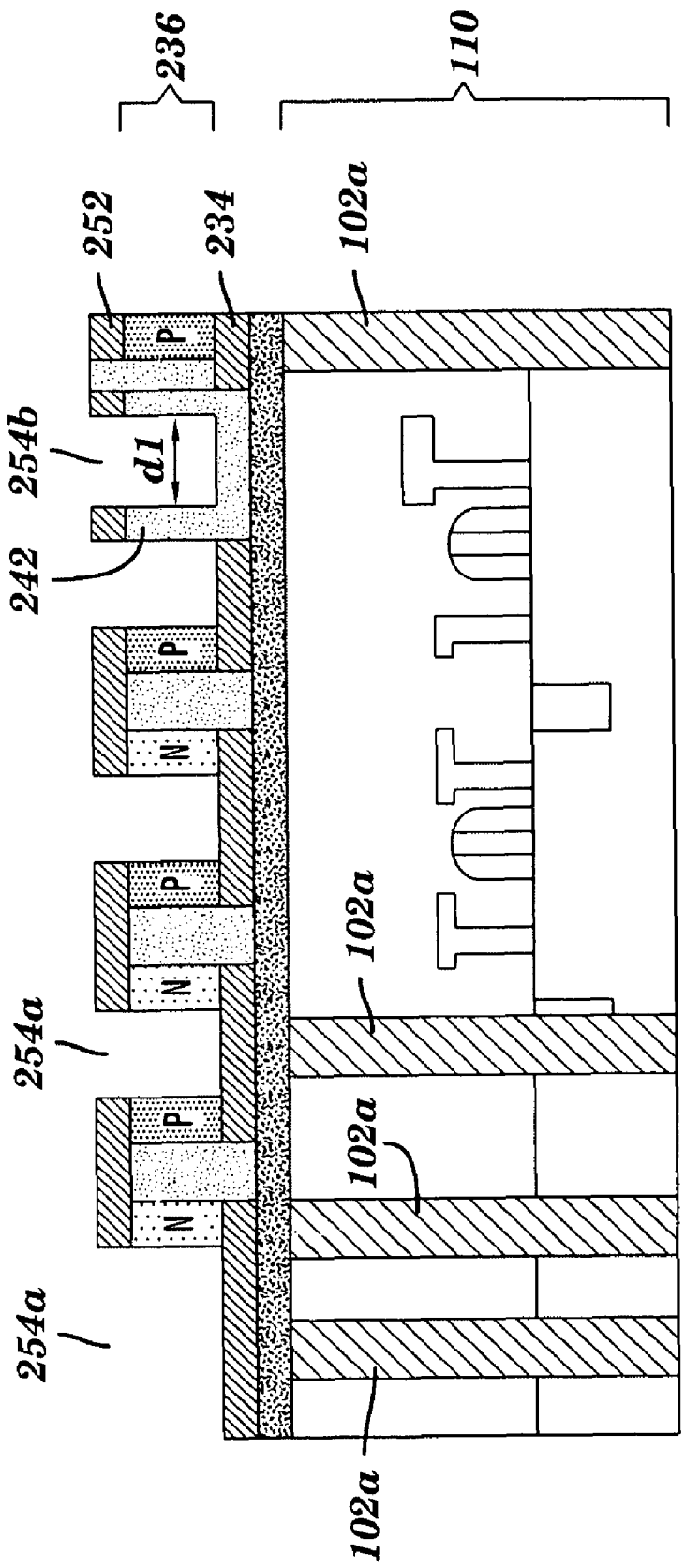

As shown in FIG. 2F, a mask is applied (not shown) and reactive ion etch (RIE) is then conducted to sequentially pattern both the conducting layer 252, the underneath thermoelectric layer 236, and dielectric 242. With respect to locations reserved for P and N type regions, RIE stops on the conducting layer 234, so that the undoped thermoelectric regions are removed to form openings 254a in the thermoelectric layer 236. With respect to the location reserved for TSV, RIE stops at a depth in the dielectric 242, such that the top of the remaining dielectric 242 is co-planar with top of conducting layer 234 to form opening 254b with a diameter d1. Diameter d1 needs to be at least 1 μm larger than diameter d2 of the TSV 102b formed in FIG. 2H.

Figure 2G:
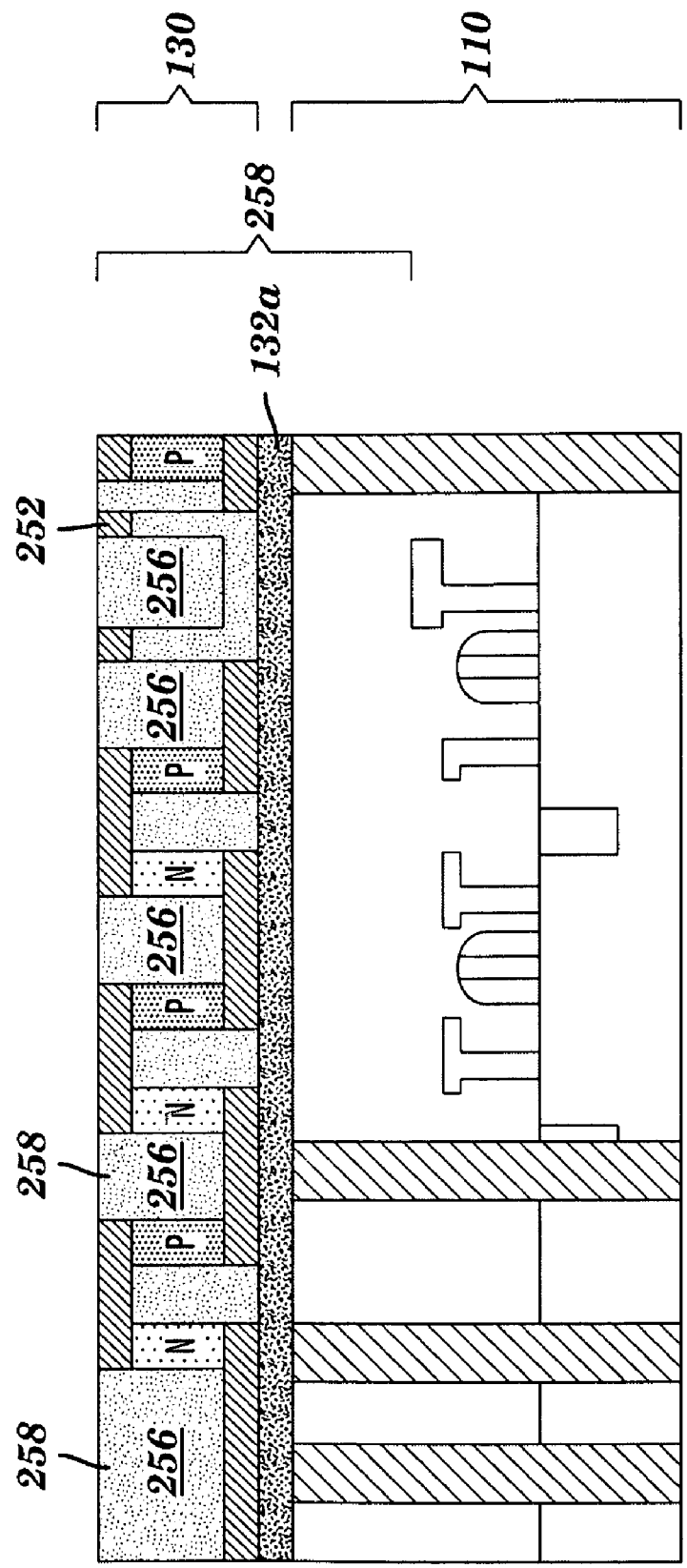

With reference to FIG. 2G, the openings which are shown created in FIG. 2F are filled with dielectric 256 followed by CMP. The dielectric 256 filled openings between doped thermoelectric elements form isolation regions 258 in the TEC plate. The dielectric 256 filled opening in the location reserved for TSV 102b isolates the TSV 102b formed in FIG. 2H from conducting layer 252. Note that dielectric materials 256 with low thermal conductivity (e.g. $SiO_2$, low-k dielectrics such as SiCOH, Silk™, etc.) should also be used here to enhance thermoelectric effect of the integrated TEC plate 130.

Figure 2H:
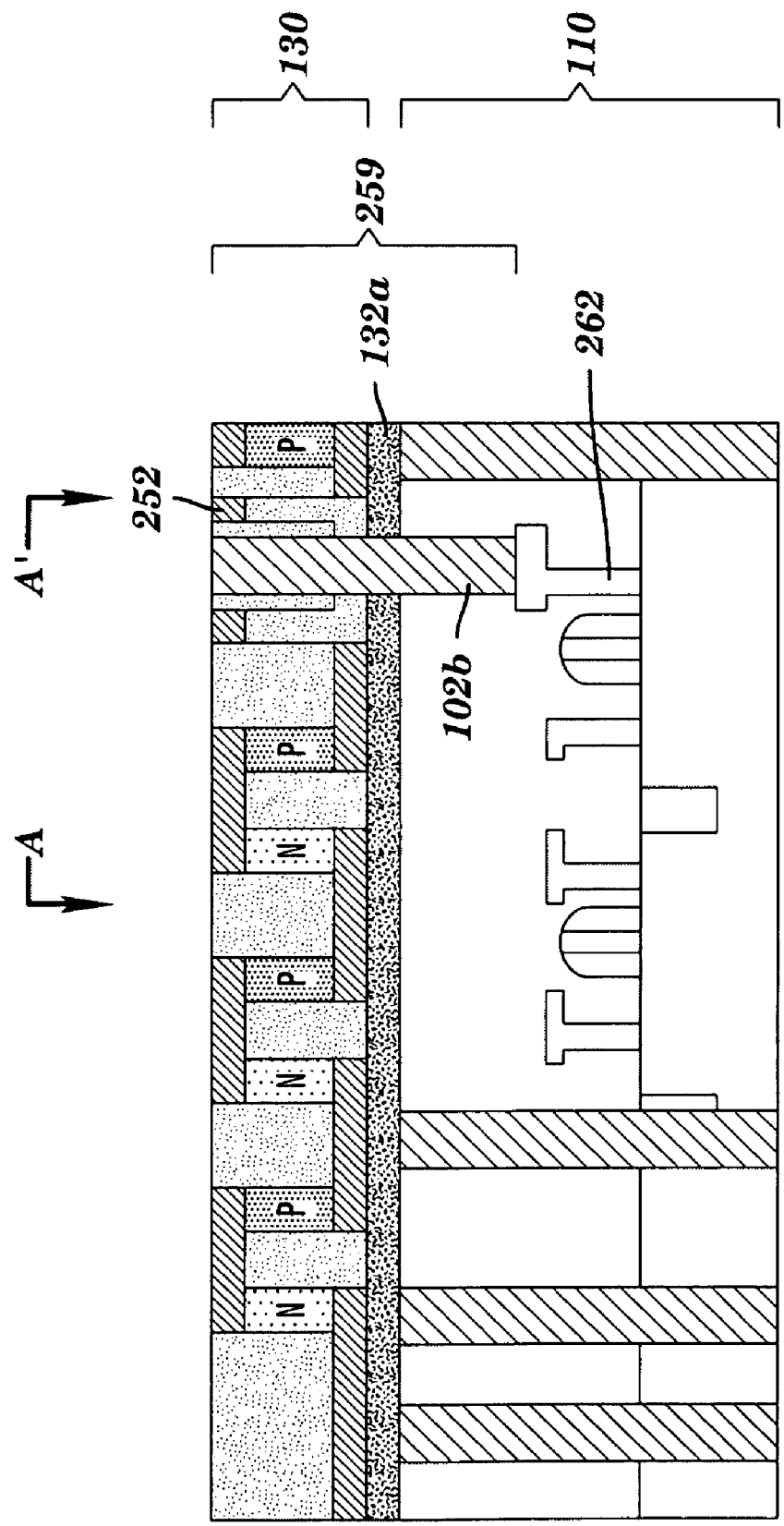
Figure 2I:
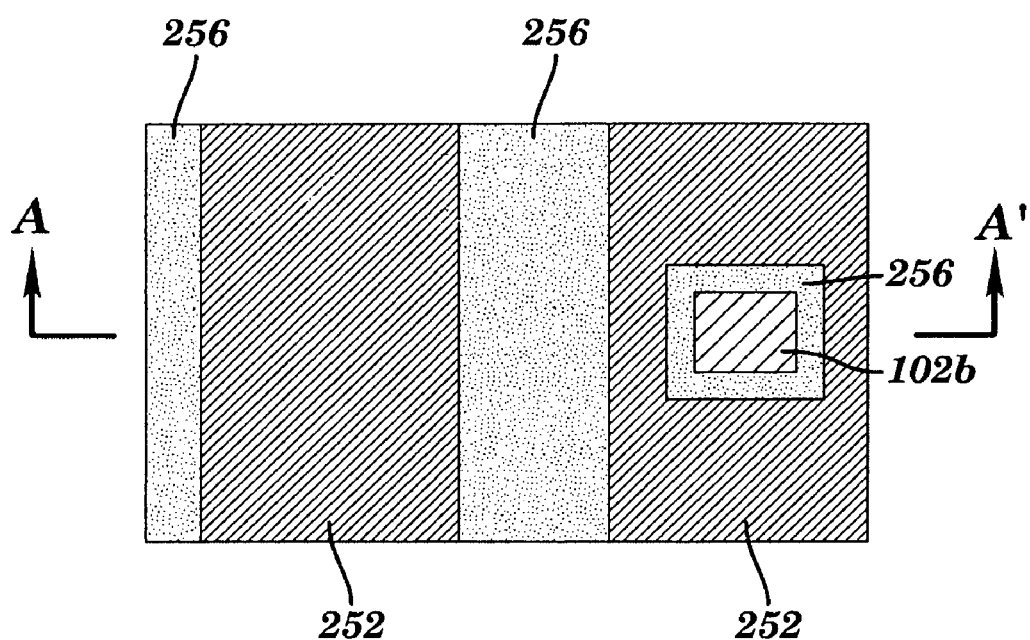

With reference to FIG. 2H, the bottom segment 259 of the electrical TSV 102b is then fabricated through the entire thickness of the TEC plate 130, the coupling layer 132a, and partially through the lower chip 110, landing on and contacting the designated metallization structure 262. Note that the electrical TSV 102b also goes through the conducting layers of the TEC plate 130, e.g. conducting layers 234, 252 in the case shown in FIG. 2H. It is important to avoid electrical short between the TSV 102b and layer 252. FIG. 2I depicts the critical electrical isolation.

With reference to FIG. 2I, to achieve the critical electrical isolation, as shown in FIG. 2H with top view over the A-A' area, the TSV 102b is surrounded by dielectric material 256 and isolated from the adjacent conducting layer 252.

Figure 2J:
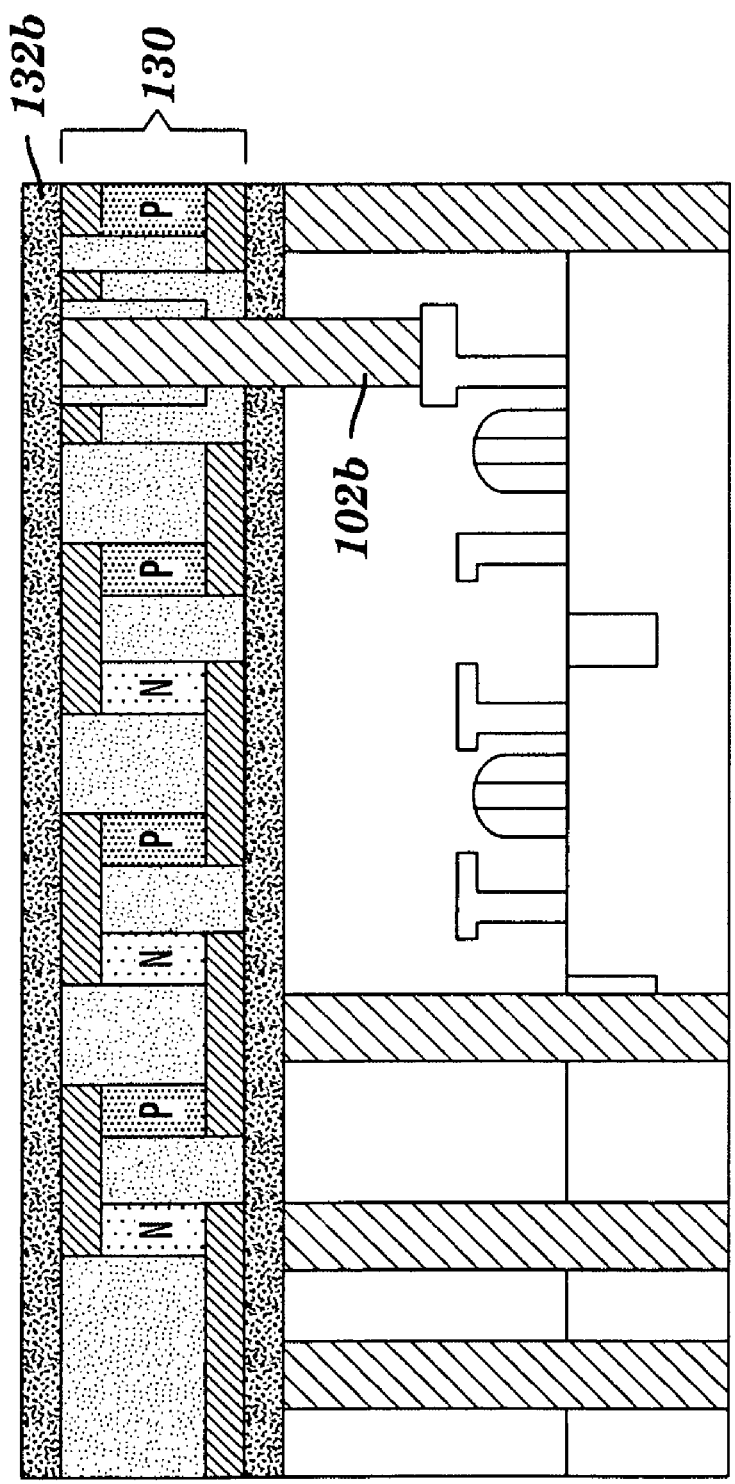

With reference to FIG. 2J, a blanket coupling layer 132b (about 10 nm~40 nm thick) is then deposited on top of the TEC plate 130 to provide electrical isolation and thermal coupling. The stack is then annealed at about 400 C~500 C in order to activate dopants in the N- and P-type thermoelectric elements.

Figure 2K:
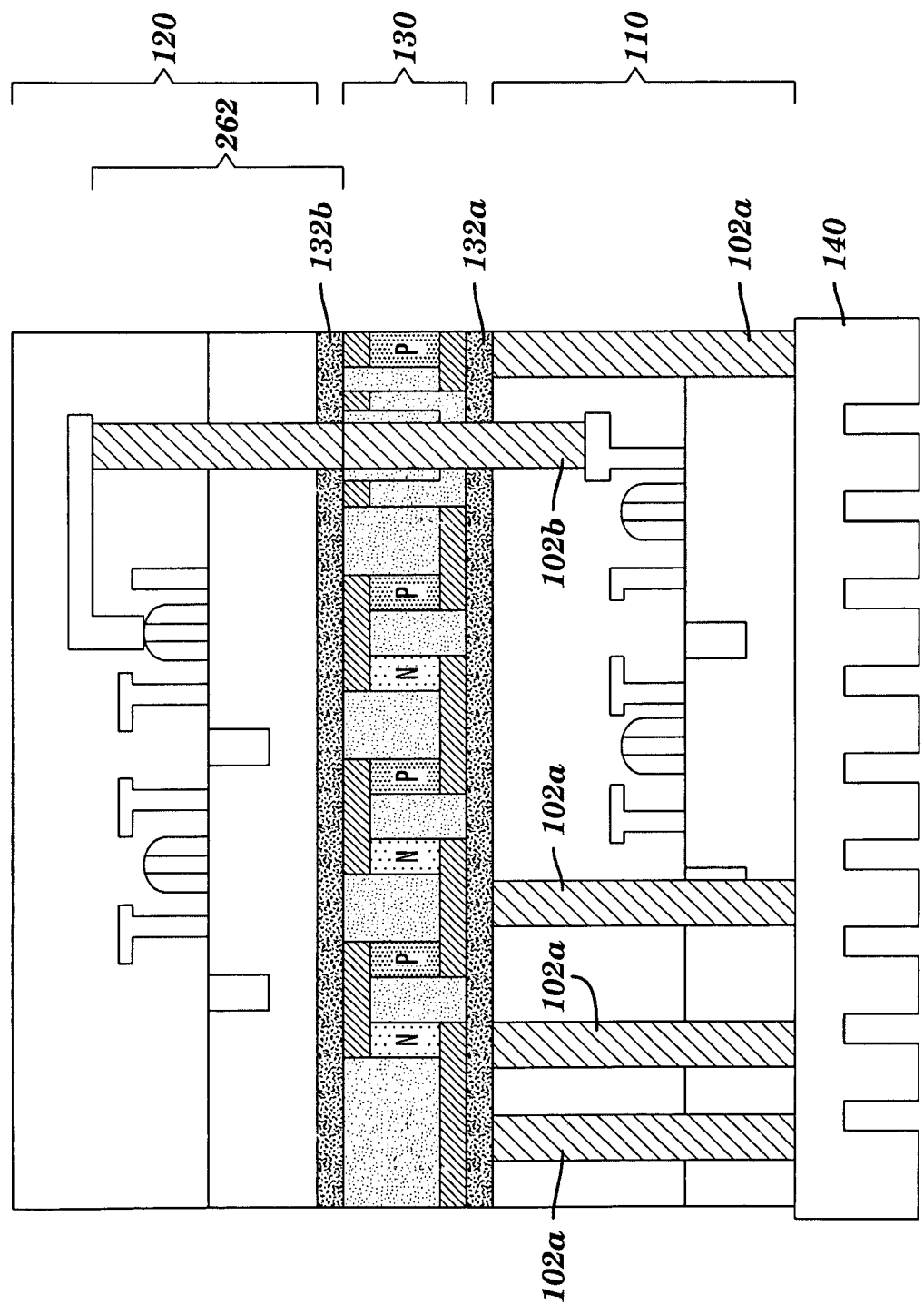

With reference to FIG. 2K, as shown in FIG. 2K, upper chip 120 is then bonded to the TEC plate 130 through the coupling layer 132b, followed by the fabrication of top segment 262 of the electrical TSV 102b and the completion of upper chip 120. Heat sink 140 is mounted to the bottom of the complete chip stack for dissipating the internal heat that is extracted from the chip stack through the TEC plate 130 and the thermal TSV's 102a. Note that a heat exchanger through liquid circulation can also be used for heat dissipation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A semiconductor structure, comprising:
   at least one first chip that includes at least one first electronic device;
   at least one second chip that includes at least one second electronic device; and,
   a thermoelectric plate that includes a first conducting layer, a second conducting layer, dielectric material, and at least one first through silicon via, said thermoelectric plate inserted between said at least one first chip and said at least one second chip, said thermoelectric plate separated from said at least one first chip by a first coupling layer and separated from said at least one second chip by a second coupling layer, wherein said at least one first through silicon via is a) electrically connected to said first electronic device and said at least one second electronic device and b) electrically isolated from said first and second conducting layers by said dielectric material, said thermoelectric plate further comprising at least one second through silicon via electronically connected to a power source and one of said first conducting layer and said second conducting layer.

2. A structure as in claim 1, said at least one first chip further comprising,
   at least one through silicon via electronically connected to said first coupling layer.

3. A structure as in claim 2, further comprising,
   one of a heat sink and a heat exchanger, wherein said at least one through silicon via in said at least one first chip is electronically connected to both said first coupling layer and said one of a heat sink and a heat exchanger.

4. A structure as in claim 3, wherein at least one pair of N-type and P-type semiconductors in said thermoelectric plate removes heat generated by at least one of an electronic device in said first chip and an electronic device in said second chip, said N-type and P-type semiconductors in said pair electronically connected to each other by said first conducting layer and said second conducting layer.

5. A structure as in claim 4, wherein said at least one through silicon via in said at least one first chip receives said heat generated through said electronically connected first coupling layer and releases said heat generated to said electronically connected one of a heat sink and a heat exchanger.

6. A structure as in claim 1, said first coupling layer comprises a thickness of 10.0 nm to 40.0 nm.

7. A structure as in claim 1, said second coupling layer comprises a thickness of 10.0 nm to 40.0 nm.

8. A structure as in claim 1, said first coupling layer comprises a material selected from a group consisting of CVD diamond and silicon carbide (SiC).

9. A structure as in claim 1, said second coupling layer comprises a material selected from a group consisting of CVD diamond and silicon carbide (SiC).

10. A structure as in claim 1, said first conducting layer and second conducting layer each comprise a thickness of 50.0 nm to 1.0 μm.

11. A structure as in claim 1, said first conducting layer and second conducting layer comprise a material selected from a group consisting of copper (Cu), aluminum (Al), and silicide.

12. A structure as in claim 1, said dielectric material comprises one of silicon dioxide (SiO2), SiCOH, SiLK™, a porous low-k dielectric, and an air-gap.

\* \* \* \* \*